United States Patent

Yoshida et al.

(10) Patent No.: US 8,446,727 B2
(45) Date of Patent: May 21, 2013

(54) ELECTRONIC COMPONENT

(75) Inventors: Tadafumi Yoshida, Nissin (JP); Hiroshi Osada, Komaki (JP); Yuji Yagi, Nisshin (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 344 days.

(21) Appl. No.: 12/436,976

(22) Filed: May 7, 2009

(65) Prior Publication Data

US 2009/0279276 A1    Nov. 12, 2009

(30) Foreign Application Priority Data

May 8, 2008    (JP) ................................. 2008-122368

(51) Int. Cl.
*H05K 7/20*    (2006.01)
(52) U.S. Cl.
USPC .......................................... 361/719; 361/709
(58) Field of Classification Search
USPC ............................ 257/722, 720; 361/681–722
See application file for complete search history.

(56) References Cited

U.S. PATENT DOCUMENTS

| | | | | |
|---|---|---|---|---|
| 4,012,832 A * | 3/1977 | Crane | ................................ | 438/4 |
| 4,092,697 A * | 5/1978 | Spaight | ......................... | 361/718 |
| 4,546,478 A * | 10/1985 | Shimizu et al. | ................. | 372/36 |
| 5,137,836 A * | 8/1992 | Lam | ................................ | 438/15 |
| 5,168,926 A * | 12/1992 | Watson et al. | ................. | 165/185 |
| 5,268,814 A * | 12/1993 | Yakubowski | ................. | 361/704 |
| 5,396,403 A * | 3/1995 | Patel | ............................ | 361/705 |
| 5,663,106 A * | 9/1997 | Karavakis et al. | .............. | 29/841 |
| 5,932,925 A * | 8/1999 | McIntyre | ....................... | 257/719 |
| 6,578,263 B2 * | 6/2003 | Ichikawa et al. | ................. | 29/870 |
| 6,642,064 B1 * | 11/2003 | Terrill et al. | .................... | 438/15 |
| 6,752,204 B2 * | 6/2004 | Dishongh et al. | ............. | 165/185 |
| 6,757,170 B2 * | 6/2004 | Lee et al. | ....................... | 361/704 |
| 6,758,263 B2 * | 7/2004 | Krassowski et al. | .......... | 165/185 |
| 6,870,736 B2 * | 3/2005 | Lee et al. | ....................... | 361/704 |
| 6,943,443 B2 * | 9/2005 | Nobori et al. | ................. | 257/704 |
| 6,947,286 B2 * | 9/2005 | Belady et al. | ................. | 361/719 |
| 6,984,888 B2 * | 1/2006 | Sung | ............................. | 257/720 |
| 7,057,277 B2 * | 6/2006 | Chen et al. | ..................... | 257/707 |
| 7,786,570 B2 * | 8/2010 | Eom et al. | ..................... | 257/706 |
| 7,787,570 B2 * | 8/2010 | Rozenblit et al. | ............. | 375/320 |
| 2003/0183950 A1 * | 10/2003 | Bolken | ........................ | 257/786 |

FOREIGN PATENT DOCUMENTS

| | | |
|---|---|---|
| EP | 1873827 | 1/2008 |
| JP | 64-20645 A | 1/1989 |
| JP | 6420645 | 1/1989 |

(Continued)

OTHER PUBLICATIONS

Office Action dated Feb. 14, 2012 from corresponding Japanese Application No. 2008-122368; 7 pgs.

(Continued)

*Primary Examiner* — Hung S Bui
(74) *Attorney, Agent, or Firm* — Gifford, Krass, Sprinkle, Anderson & Citkowski, P.C.

(57) ABSTRACT

There is provided an electronic component which comprises an insulating member on which an electronic element is mounted, and a thermal diffusion member on which the insulating member is mounted, wherein a thermal expansion coefficient of the insulating member is lower than a thermal expansion coefficient of the thermal diffusion member, and the insulating member is mounted in an embedded manner in a recess formed on a surface of the thermal diffusion member.

20 Claims, 9 Drawing Sheets

FOREIGN PATENT DOCUMENTS

| | | |
|---|---|---|
| JP | 6420645 A | 1/1989 |
| JP | 3248550 A | 11/1991 |
| JP | 05-062048 U | 8/1993 |
| JP | 7312474 | 11/1995 |
| JP | 2001267447 | 9/2001 |
| JP | 2002-043479 A | 2/2002 |
| JP | 2002-043480 A | 2/2002 |
| JP | 2002217346 A | 8/2002 |
| JP | 2006294699 | 10/2006 |

OTHER PUBLICATIONS

Office Action dated Dec. 20, 2011 from corresponding Chinese Application No. 200910138567.4 with partial English translation; 9 pgs.

* cited by examiner

ELECTRONIC COMPONENT

CROSS-REFERENCE TO RELATED APPLICATION

This application claims priority to Japanese Patent Application No. 2008-122368.

BACKGROUND OF THE INVENTION

1. Field of the Invention

The present invention relates to an electronic component which is durable against stress.

2. Description of the Related Art

In general, as shown in FIG. 9, an electronic component 100 is in many cases used in a structure in which an electronic element 10 is mounted on a thermal diffusion plate 14 with an insulating board 12 therebetween. When such a mounting structure is employed, a crack or the like may be formed in the insulating board 12 due to thermal stress or residual stress when the electric component is subjected to a thermal cycle, ultimately resulting in an adverse effect on the characteristics of the electronic element 10.

In consideration of this, there is known a structure in which a stress-alleviating member 16 made of aluminum and having a plurality of through holes formed therein is provided between the insulating board 12 and the thermal diffusion plate 14. It is said that, with this structure, superior thermal conduction can be achieved between the insulating board 12 and the thermal diffusion plate 14, improvement is realized in a heat dissipation performance from the electronic element 10, and the influence by the stress can be reduced due to a function of a stress-absorbing space including the through holes.

In addition, there is known a technique in which, in a ceramic circuit board having a ceramic board and a metal plate which is directly joined on a surface of the ceramic board and which primarily comprises aluminum, a thinned thickness section, having a thickness of $\frac{1}{6}$ to $\frac{5}{6}$ that of the portion of the metal plate on which the metal plate is mounted, is provided inside of the outer periphery portion of the metal plate, to reduce the influence of the stress.

Moreover, there is known a technique in which, when a steel plate which serves as a base member and a silicon chip which is an electronic component are joined with solder therebetween, a cut-out section is formed over the entire outer periphery of the joining surface of the silicon chip and the steel plate and the silicon chip are joined, so that the stress is spread out and alleviated.

As described, in an electronic component of a layered structure, there must be employed a structure in which the influence of stress with respect to the thermal cycle or the like is reduced.

However, in the electronic components of the related art, when a crack is formed in a part of the layered structure, the crack may extend to the joining interface and may reach a portion directly below the electronic element, possibly resulting in an increase in the thermal resistance from the electronic element to the thermal diffusion member or an increase in insulation deficiency, and, consequently, prevention of an improvement in the reliability or an increase in the lifetime of the electronic component.

In addition, a special member such as the stress-alleviating member must be provided in order to suppress the extension of the crack, possibly resulting in a secondary problem such as an increase in the manufacturing cost of the electronic component.

SUMMARY OF THE INVENTION

The present invention relates to an electronic component. According to one aspect of the present invention, there is provided an electronic component comprising a first member on which an electronic element is mounted, and a second member on which the first member is mounted, wherein a thermal expansion coefficient of the first member is lower than a thermal expansion coefficient of the second member, and the first member is mounted in an embedded manner in a recess formed on a surface of the second member.

BRIEF DESCRIPTION OF THE DRAWINGS

An exemplary embodiment of the present invention will be described in detail by reference to the following figures, wherein.

DESCRIPTION OF THE PREFERRED EMBODIMENT

Figure 1:
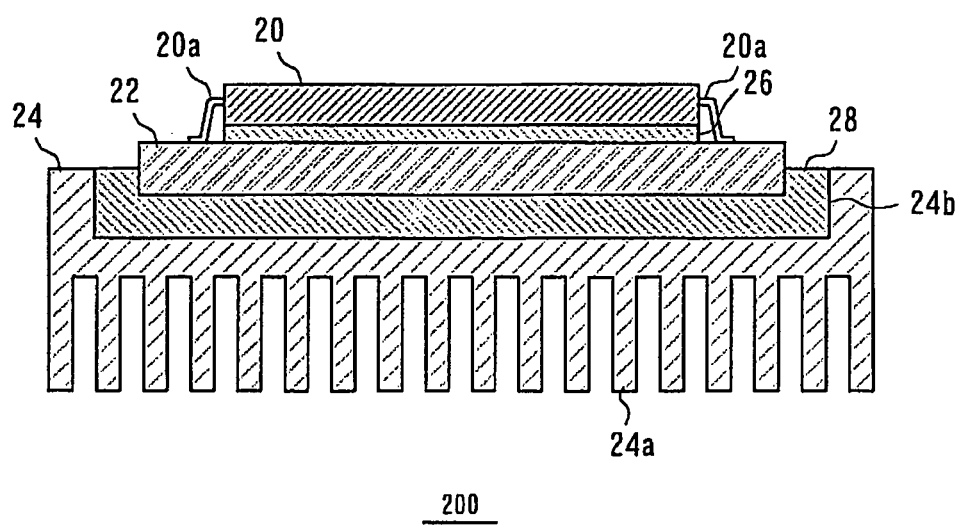
FIG. 1 is a cross sectional diagram showing the structure of an electronic component according to a preferred embodiment of the present invention.

As shown in a cross sectional diagram of FIG. 1, an electronic component 200 according to a preferred embodiment of the present invention comprises an electronic element 20, an insulating member 22, and a thermal diffusion member 24. The insulating member 22 includes a first side and an opposite second side, the second side of the insulating member 22 is mounted on a surface of the thermal diffusion member 24, and the electronic element 20 is mounted on a first side of the insulating member 22.

The electronic element 20 comprises a semiconductor integrated circuit (IC), a resistor element, a capacitor, an inductor, etc. The electronic element 20 can be constructed by storing an electronic element chip in a package of a DIP type, an SIP type, a BGA type, or the like. In the present embodiment, because the electronic component 200 is durable against a stress which occurs due to a thermal cycle or the like, the electronic component is advantageous in, for example, a structure including an electronic element of large power consumption, such as an IGBT having high heat generation during the use of the element, or a power MOSFET.

The insulating member 22 is a member which prevents an electrical connection between the electronic element 20 and the thermal diffusion member 24. As shown in the assembly diagram of FIG. 2, the insulating member 22 in the present embodiment is a plate-shaped member having a short side L1, a long side L2, and a thickness T.

The insulating member 22 may be of any material, so long as the material satisfies the required insulating characteristic, the required thermal conductivity, and the required mechanical strength. For example, the insulating member 22 may comprise a ceramic such as aluminum oxide or aluminum nitride.

A circuit layer is formed on a surface of the insulating member 22, and a pin 20a of the electronic element 20 is joined to the circuit layer with solder or the like, to achieve an electrical connection. The circuit layer is formed from a conductive material such as aluminum, copper, silver, gold, etc., which has superior conductivity. The region between the insulating member 22 and the electronic element 20 may be joined with solder or, alternatively, a grease 26 such as an organic silicon compound polymer may be applied and sandwiched between the insulating member 22 and the electronic element, in order to improve thermal conductivity.

The thermal diffusion member 24 is a member for diffusing the heat generated from the electronic element 20, to thereby reduce the temperature of the electronic component 200. The thermal diffusion member 24 may sometimes be called a heat dissipater or a heat-dissipating plate. The material of the thermal diffusion member 24 is preferably a metal having a higher linear expansion coefficient and a higher thermal conductivity than the insulating member 22, such as aluminum or copper.

The performance of the thermal diffusion member 24 is represented by thermal resistance. A lower thermal resistance indicates a higher performance, and the applied heat can be more efficiently dissipated. The thermal resistance is determined based on the material, size, shape, etc. of the thermal diffusion member 24. Preferably, a shape with a fin 24a or the like is employed to increase the surface area, and, consequently, the thermal conductive performance of the thermal diffusion member 24. A coolant for cooling the thermal diffusion member 24 may be a gas such as air or a liquid such as water. In addition, it is also possible to forcibly cool the thermal diffusion member 24 with a coolant by providing a fan or a pump to improve the cooling capability.

Figure 2:
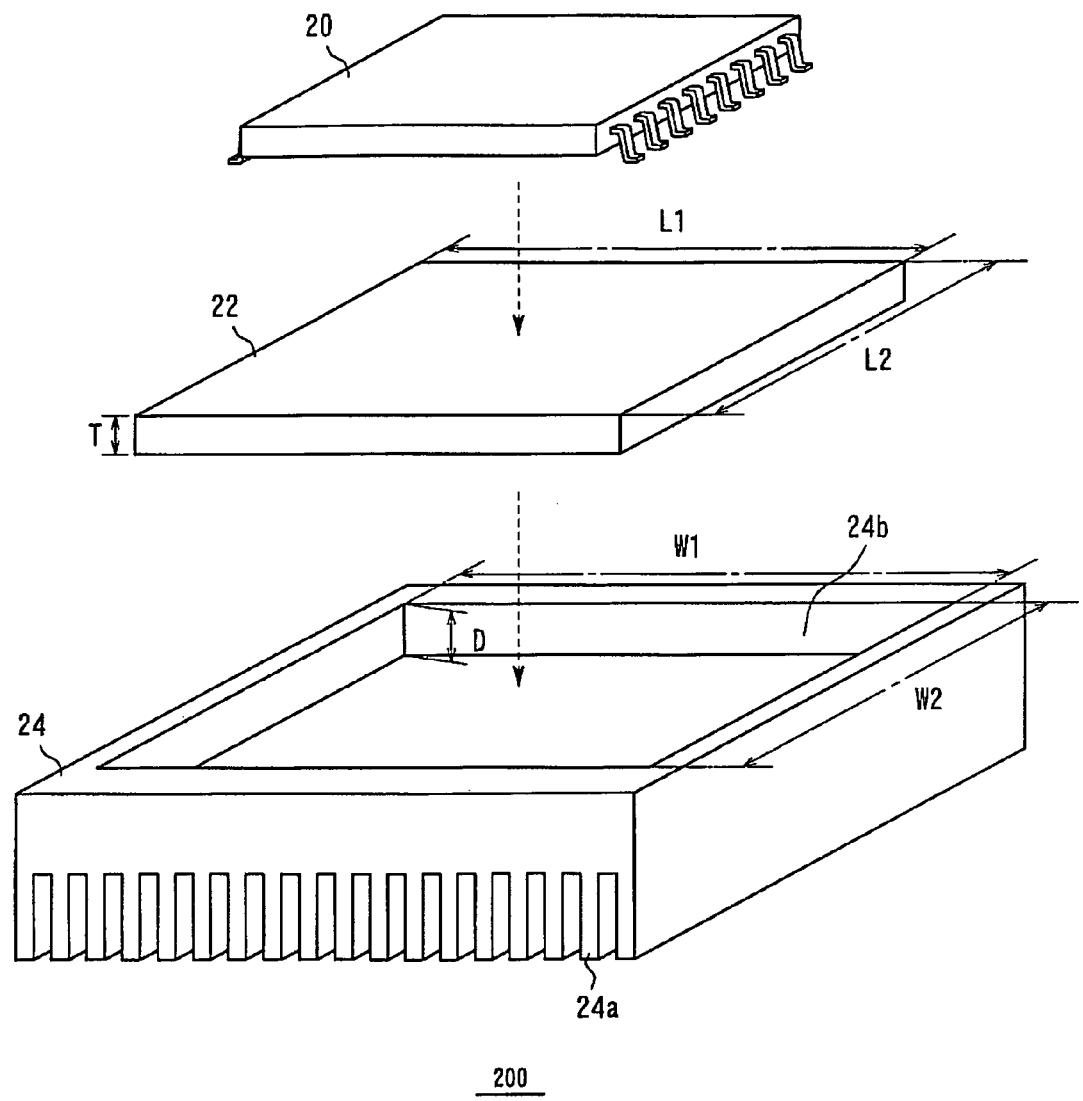
FIG. 2 is an assembly diagram showing the structure of the electronic component according to a preferred embodiment of the present invention.

In the present embodiment, as shown in the cross sectional diagram of FIG. 1 and the assembly diagram of FIG. 2, a recess 24b is formed on the surface of the thermal diffusion member 24. The recess 24b is formed of two pair of opposing sides. A solder member 28 is filled in the recess 24b of the thermal diffusion member 24, and the second side of the insulating member 22 is fixed on the thermal diffusion member 24 in an embedded manner in the recess 24b from a backside, of the insulating member 22, on which the electronic element 20 is not mounted. In this manner, the insulating member 22 is mounted on the thermal diffusion member 24 with the solder member 28 therebetween.

As the solder member 28, a normal solder which is an alloy of lead and tin may be used, or, alternatively, a lead-free solder is preferably used in consideration of the environment. The solder member 28 preferably has a linear expansion coefficient which is lower than that of the thermal diffusion member 24 and higher than that of the insulating member 22.

It is also preferable to set a short side W1 and a long side W2 of the recess 24b to be slightly larger than the short side L1 and the long side L2 of the insulating member 22. With such a structure, the insulating member 22 can be placed in the recess 24b. It is also preferable that a depth D of the recess 24b be set to at least ¼ the thickness T of the insulating member 22. It is preferable to set the depth D to at least ¼ of the thickness T of the insulting member 22 in this manner, to thereby embed ¼ or more of the thickness of the insulating member 22 in the recess 24b.

By placing the insulating member 22 in an embedded manner in the recess 24b of the thermal diffusion member 24, it is possible to reduce the influence by a difference in the linear expansion coefficient between the thermal diffusion member 24 and the insulating member 22.

Figure 3:
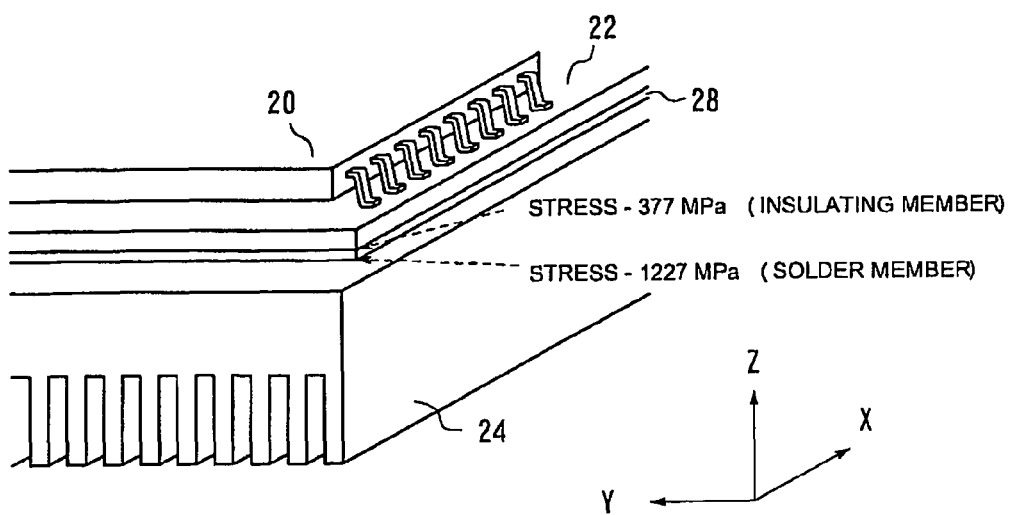
FIG. 3 is a diagram showing a result of a simulation of stress in a structure of an electronic component of the related art.
Figure 4:
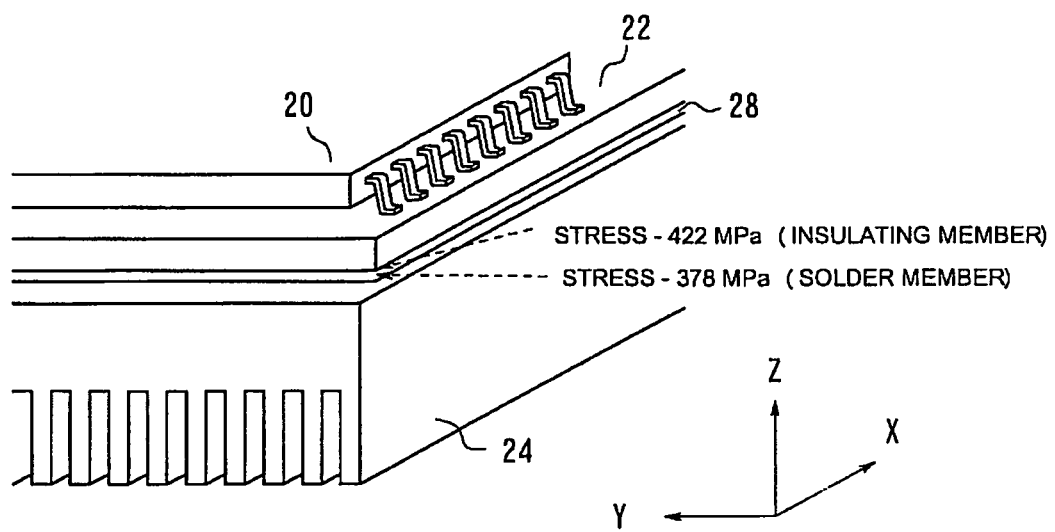
FIG. 4 is a diagram showing a result of a simulation of stress in a structure of the electronic component according to the preferred embodiment of the present invention.

FIG. 3 shows a result of a simulation of a strength of the stress at the joining portion between the thermal diffusion member 24 and the insulating member 22 in the electronic component of the related art having a layered structure which is not an embedded structure. FIG. 4 shows a result of a simulation of the strength of the stress at the joining portion of the thermal diffusion member 24 and the insulating member 22 in the electronic component 200 of the present embodiment. FIGS. 3 and 4 show results of simulation of the thermal stress when the stress is assumed to be zero in the state where the electronic component is maintained at approximately 230° C. which is a joining temperature of the solder member 28, and the electronic component is maintained at 0° C. In the simulation, the linear expansion coefficient of the insulating member is set to 10 ppm/K and the linear expansion coefficient of the thermal diffusion member is set to 20 ppm/K.

As is clear from FIGS. 3 and 4, the stress applied between the thermal diffusion member 24 and the insulating member 22 is alleviated in the electronic component 200 of the present embodiment as compared with the case of the electronic component of the related art. In particular, in a portion where, in general, a stress is concentrated such as a region near the corner of the insulating member 22, the stress applied to the electronic component 200 of the present embodiment is smaller than in the case of the related art. More specifically, the stress applied on the solder member 28 is −1227 MPa in the case without the embedded structure, whereas the stress is reduced to −378 MPa in the case with the embedded structure. This is because, with the insulating member 22 being embedded with the soldering member 28 therebetween, the thermal deformation behavior of the insulating member 22 can easily follow the thermal diffusion member 24, and, as a result, the stress applied to the X-Y plane which is the primary thermal expansion direction is reduced and the stress is diffused to the side surfaces through the recess solder member. In addition, it can also be considered that, because the interface direction of the joining open end between the members in the embedded structure is the recess depth direction Z and the joining length in the Z direction is short, the thermal expansion difference is reduced and stress concentration does not tend to occur at the open end.

Figure 5:
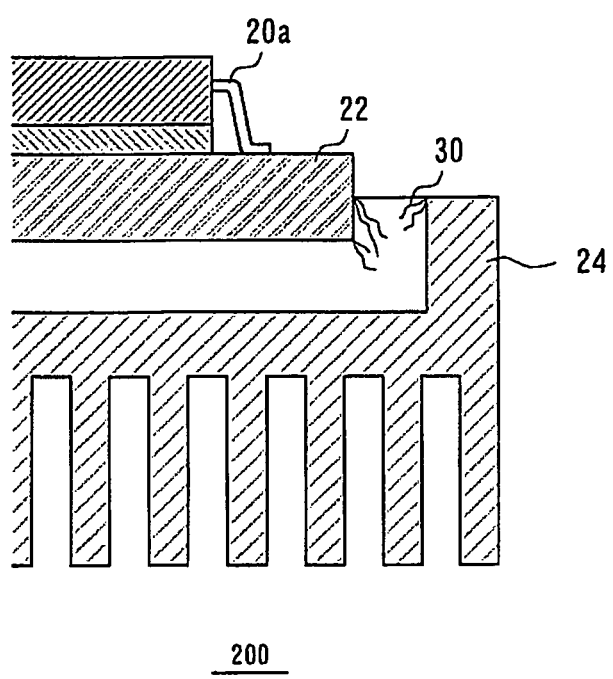
FIG. 5 is a conceptual diagram showing a state of formation of a crack in the preferred embodiment of the present invention.

Moreover, as shown in the conceptual diagram of FIG. 5, a crack 30 formed in the soldering member 28 embedded between the insulating member 22 and the thermal diffusion member 24 extends also in the depth direction Z of the recess 24b of the thermal diffusion member 24 which is orthogonal to the plane direction X-Y which is the primary thermal expansion direction of the insulating member 22 and the thermal diffusion member 24. In other words, in the electronic component having the layered structure of the related art, the members are joined within a plane and the direction of extension of the crack 30 due to the stress coincides with the direction of expansion of the member by the stress. In the present embodiment, on the other hand, with the embedded structure, it can be deduced that the extension in the plane direction is suppressed by setting the extension direction of the crack 30 in the depth direction of the solder member 28.

With this structure, the extension of the crack 30 to the region, of the insulating member 22, directly below the electronic element 20 is suppressed, and the reliability of the electronic component 200 can be improved. In particular, when the crack 30 extends to the region, of the insulating member 22, directly below the electronic element 20, the thermal resistance from the electronic element 20 to the thermal diffusion member 24 is increased and the cooling efficiency of the electronic element 20 is significantly reduced. The present embodiment is advantageous in preventing such a phenomenon.

There is also another advantage that provision of the recess 24b facilitates positioning and holding when the insulating member 22 is incorporated into the thermal diffusion member 24.

Moreover, because the solder member 28 is filled in the recess 24b, it is possible to prevent overflow of the solder member 28 onto the surface of the thermal diffusion member 24.

<First Alternative Embodiment>

Figure 6:
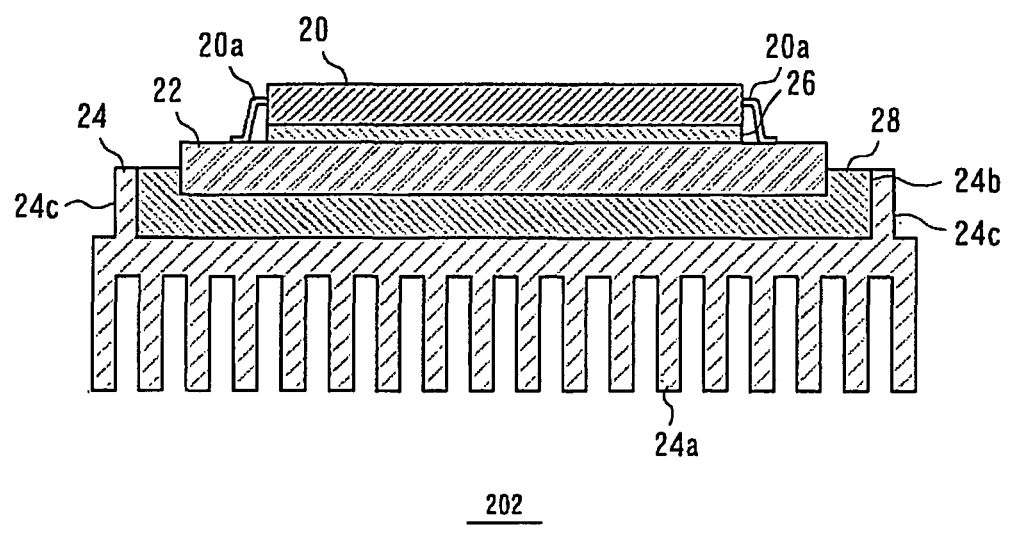
FIG. 6 is a cross sectional diagram showing the structure of an electronic component in a first alternative embodiment of the present invention.

FIG. 6 is a cross sectional diagram of an electronic component 202 of an alternative embodiment of the preferred embodiment of the present invention. In the present alternative embodiment, a step 24c for forming the recess 24b is provided on the front surface side of the thermal diffusion member 24. In all other respects, the structure is similar to that of the above-described preferred embodiment. Such a structure can also achieve the operation and advantage similar to those of the above-described preferred embodiment.

In the present alternative embodiment, because the step 24c is employed and the frame thickness is reduced, the amount of thermal expansion in the plane direction is reduced and the influence to the insulating member 22 by the thermal expansion of the thermal diffusion member 24 can be further reduced.

<Second Alternative Embodiment>

Figure 7A:
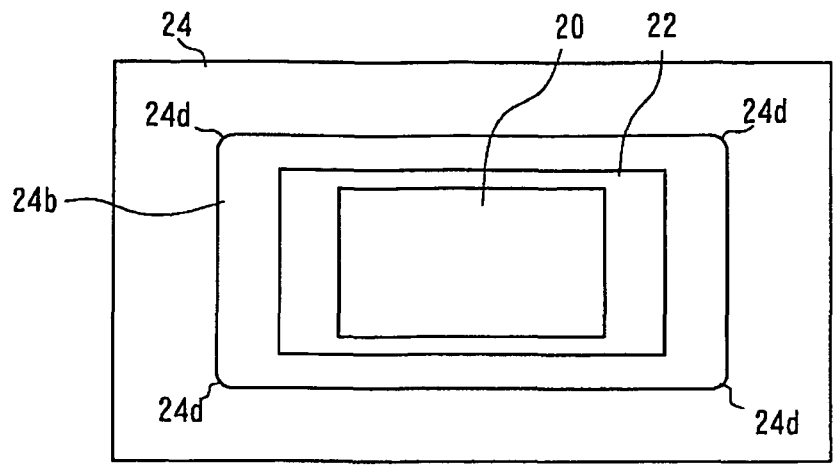
FIGS. 7A and 7B are plan views showing the structure of an electronic component according to a second alternative embodiment of the present invention.
Figure 7B:
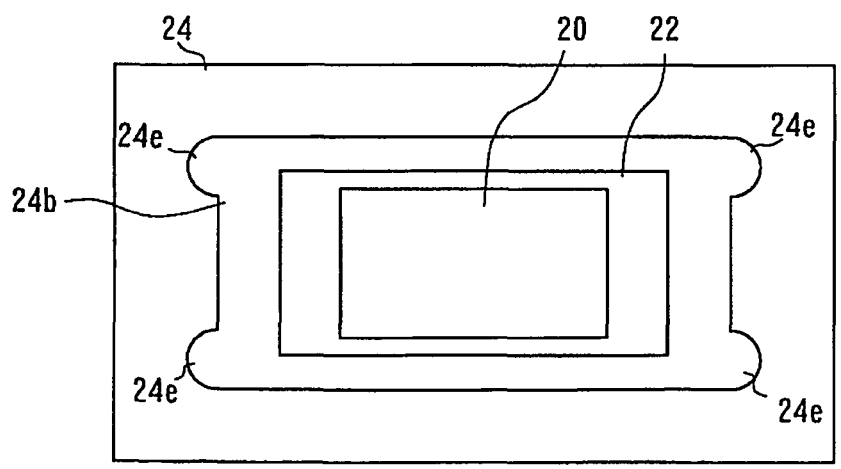

FIGS. 7A and 7B show a plan view of an electronic component 202 of another alternative embodiment of the preferred embodiment of the present invention. In the present alternative embodiment, a corner of the recess 24b formed on the thermal diffusion member 24 is machined to a curved surface shape or to an escape structure.

In FIG. 7A, a corner 24d formed by the side surfaces of the recess 24b formed on the thermal diffusion member 24 is machined to an arc shape as viewed from the front surface side of the thermal diffusion member 24. In FIG. 7B, a semicircular recess end 24e is provided protruding from a corner of the recess 24b formed on the thermal diffusion member 24.

By machining the corner of the recess 24b formed on the thermal diffusion member 24 to a curved shape or to an escape structure in this manner, it is possible to further alleviate and spread the stress applied to the corner of the recess 24b of the thermal diffusion member 24. Because the amount of thermal expansion along the long side of the recess 24b is greater than the amount of thermal expansion along the short side, preferably, as shown in FIG. 7B, the recess end 24e be provided to protrude from the short side of the recess 24b and along the long side of the recess 24b.

The structure of the present alternative embodiment can be applied to both the above-described preferred embodiment and the above-described first alternative embodiment. In either case, the stress applied to the corner of the recess 24b of the thermal diffusion member 24 can be further alleviated and spread.

<Third Alternative Embodiment>

Figure 8A:
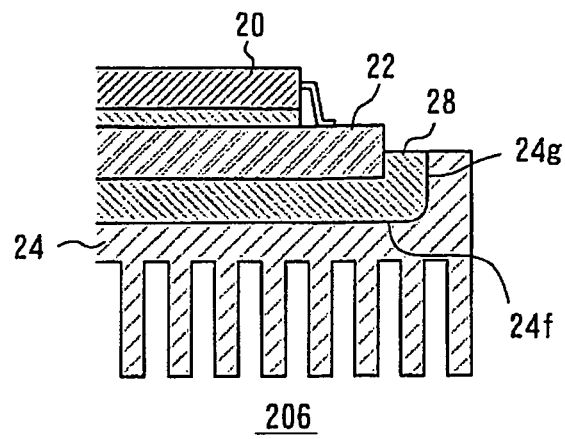
FIGS. 8A and 8B are cross sectional diagrams showing the structure of an electronic component according to a third alternative embodiment of the present invention.
Figure 8B:
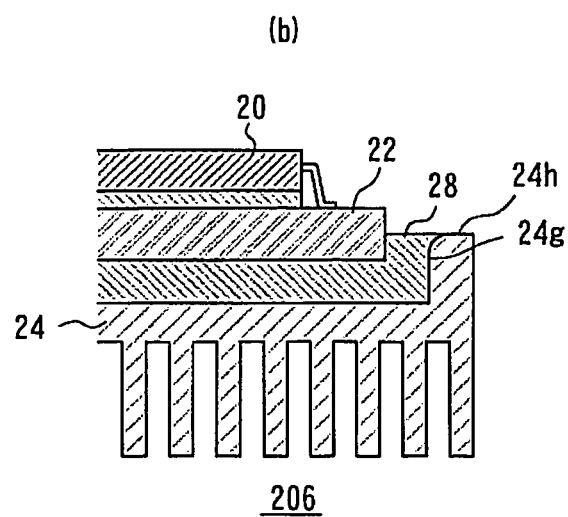
Figure 9:
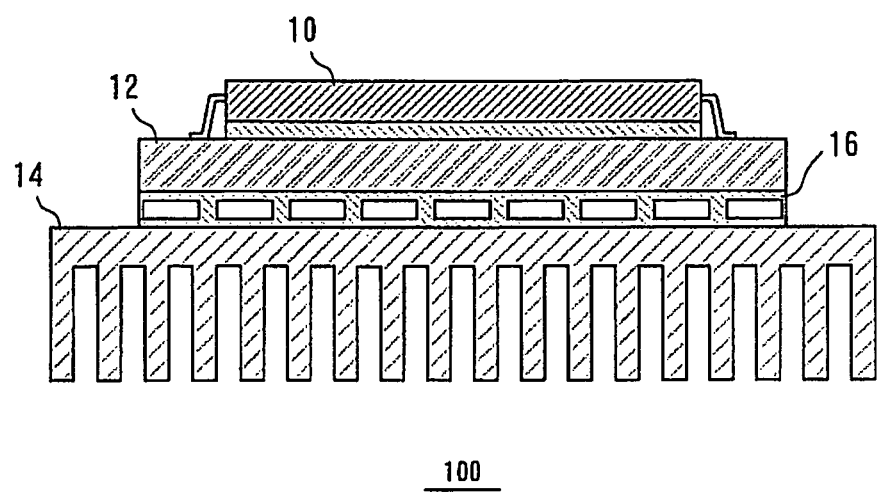
FIG. 9 is a cross sectional diagram showing the structure of an electronic component according to the related art.

FIGS. 8A and 8B are local cross sectional diagrams of an electronic component 206 of an alternative embodiment of the preferred embodiment of the present invention. FIGS. 8A and 8B are diagrams showing, in an enlarged manner, the recess 24b to which the insulating member 22 is embedded.

FIG. 8A shows a configuration where a corner formed by a bottom portion 24f and the inner side surface 24g of the recess 24b is machined to a curved shape. FIG. 8B shows a configuration where the corner formed by the inner side surface 24g and a front surface 24h of the recess 24b is machined to a curved shape.

By machining the corner of the recess 24b formed on the thermal diffusion member 24 in this manner, it is possible to further alleviate and spread the stress applied to the corner of the recess 24b of the thermal diffusion member 24. By applying both configuration of FIG. 8A and that of FIG. 8B, it is possible to obtain a further improved advantage. The present alternative embodiment can be combined with any of the above-described preferred embodiment and the above-described first and second alternative embodiments.

What is claimed is:

1. An electronic component, comprising:
   a first member having a first side and an opposite second side, the first side having an electronic element mounted thereon; and
   a second member having a surface and two pair of opposing step walls spaced apart from an edge of the surface of the second member, the two pair of opposing step walls protrude outwardly from the surface of the second member to define a recess,
   wherein the recess provided within the second member is filled with a solder member and the second side of the first member is embedded partially within the solder member, and wherein a thermal expansion coefficient of the first member is lower than a thermal expansion coefficient of the second member.

2. The electronic component according to claim 1, wherein the surface of the second member acts as a bottom portion of the recess.

3. The electronic component according to claim 2, wherein a depth of the recess is greater than or equal to ¼ the thickness of the first member.

4. The electronic component according to claim 2, wherein a corner of the two pair of opposing step walls has a curved shape.

5. The electronic component according to claim 2, wherein a corner of the interior side of each of the two pair of opposing step walls and the surface of the second member has a curved shape.

6. The electronic component according to claim 2, wherein an escaping structure protrudes from a corner of the two pair of opposing step walls.

7. The electronic component according to claim 6, wherein the escaping structure has a semicircular shape that extends beyond at least one of the two pair of opposing step walls.

8. The electronic component according to claim 2, wherein an upper edge of an interior side of each of the two pair of opposing step walls has a curved shape.

9. The electronic component according to claim 1, wherein a depth of the recess is greater than or equal to ¼ the thickness of the first member.

10. The electronic component according to claim 9, wherein a corner of the two pair of opposing step walls has a curved shape.

11. The electronic component according to claim 9, wherein an escaping structure protrudes from a corner of the two pair of opposing step walls.

12. The electronic component according to claim 11, wherein the escaping structure has a semicircular shape that extends beyond at least one of the two pair of opposing step walls.

13. The electronic component according to claim 9, wherein an upper edge of an interior side of each of the two pair of opposing step walls has a curved shape.

14. The electronic component according to claim 9, wherein a corner of the interior side of each of the two pair of opposing step walls and a bottom surface of the recess has a curved shape.

15. The electronic component according to claim 1, wherein a corner of the two pair of opposing step walls has a curved shape.

16. The electronic component according to claim 1, wherein an escaping structure protrudes from a corner of the two pair of opposing step walls.

17. The electronic component according to claim 16, wherein the escaping structure has a semicircular shape that extends beyond at least one of the two pair of opposing step walls.

18. The electronic component according to claim 1, wherein the solder member has a linear expansion coefficient which is higher than a linear expansion coefficient of the first member and lower than a linear expansion coefficient of the second member.

19. The electronic component according to claim 1, wherein an upper edge of an interior side of each of the two pair of opposing step walls has a curved shape.

20. The electronic component according to claim 1, wherein a corner of the interior side of each of the two pair of opposing step walls and a bottom surface of the recess has a curved shape.

* * * * *